US012640405B2

(12) United States Patent
Jung

(10) Patent No.: US 12,640,405 B2
(45) Date of Patent: May 26, 2026

(54) CONFIGURATION OF BATTERY MANAGEMENT DEVICE FOR TEMPERATURE MEASUREMENT OF MICROCONTROLLER, AND CONTROL METHOD THEREFOR

(71) Applicant: LG ENERGY SOLUTION, LTD., Seoul (KR)

(72) Inventor: Jin Kyu Jung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 596 days.

(21) Appl. No.: 18/029,478

(22) PCT Filed: Jun. 10, 2022

(86) PCT No.: PCT/KR2022/008219
§ 371 (c)(1),
(2) Date: Mar. 30, 2023

(87) PCT Pub. No.: WO2022/265312
PCT Pub. Date: Dec. 22, 2022

(65) Prior Publication Data
US 2023/0369659 A1 Nov. 16, 2023

(30) Foreign Application Priority Data

Jun. 15, 2021 (KR) ........................ 10-2021-0077454

(51) Int. Cl.
*H02J 7/00* (2026.01)
*G01R 31/36* (2020.01)
(Continued)

(52) U.S. Cl.
CPC ...... *H01M 10/425* (2013.01); *G01R 31/3648* (2013.01); *G01R 31/367* (2019.01);
(Continued)

(58) Field of Classification Search
USPC .................................................. 320/150–153
See application file for complete search history.

(56) References Cited

U.S. PATENT DOCUMENTS

| | | | |
|---|---|---|---|
| 10,063,068 B1 | 8/2018 | McCormick | |
| 2012/0297211 A1* | 11/2012 | Lee | G06F 8/65 713/310 |

(Continued)

FOREIGN PATENT DOCUMENTS

| | | |
|---|---|---|
| CN | 202495778 U | 10/2012 |
| CN | 104122005 A | 10/2014 |

(Continued)

OTHER PUBLICATIONS

Supplementary European Search Report for European Application No. 22825237.5, dated Mar. 13, 2024.

(Continued)

*Primary Examiner* — Samuel Berhanu
(74) *Attorney, Agent, or Firm* — Birch, Stewart, Kolasch & Birch, LLP

(57) ABSTRACT

The present invention relates to a temperature measurement device of a microcontroller of a battery management system (BMS) and a method therefor, and enables accurate temperature measurement of a microcontroller while facilitating channel utilization by connecting a temperature measurement device for a microcontroller and a temperature measurement device for an application to one channel of the microcontroller.

9 Claims, 3 Drawing Sheets

(51) Int. Cl.

| | |
|---|---|
| *G01R 31/367* | (2019.01) |
| *H01M 10/42* | (2006.01) |
| *H01M 10/48* | (2006.01) |

(52) U.S. Cl.
CPC .................... *H01M 10/486* (2013.01); *H01M 2010/4271* (2013.01); *H01M 2010/4278* (2013.01)

(56) References Cited

U.S. PATENT DOCUMENTS

| | | | |
|---|---|---|---|
| 2013/0227261 A1 | 8/2013 | Anderson et al. | |
| 2013/0308684 A1 | 11/2013 | Fluhrer et al. | |
| 2017/0337068 A1 | 11/2017 | Maria | |
| 2019/0006724 A1 | 1/2019 | Cho et al. | |
| 2019/0073268 A1 | 3/2019 | Kantor et al. | |
| 2019/0145833 A1* | 5/2019 | Ryu .................... | H01M 50/569 |
| | | | 340/870.17 |
| 2020/0052346 A1 | 2/2020 | Park | |
| 2020/0136211 A1 | 4/2020 | Nam et al. | |
| 2021/0336301 A1 | 10/2021 | Hwang et al. | |

FOREIGN PATENT DOCUMENTS

| | | | |
|---|---|---|---|
| DE | 10 2018 114 791 B3 | | 10/2019 |
| EP | 1 705 565 A2 | | 9/2006 |
| JP | 2002-100413 A | | 4/2002 |
| JP | 2006-200914 A | | 8/2006 |
| JP | 2008-71149 A | | 3/2008 |
| JP | 2009-294052 A | | 12/2009 |
| JP | 4934419 B2 | | 5/2012 |
| JP | 2012-244853 A | | 12/2012 |
| JP | 2013-233057 A | | 11/2013 |
| KR | 10-2005-0065553 A | | 6/2005 |
| KR | 10-2015-0066635 A | | 6/2015 |
| KR | 10-2018-0018040 A | | 2/2018 |
| KR | 10-2018-0114838 A | | 10/2018 |
| KR | 10-2019-0031990 A | | 3/2019 |
| KR | 10-2019-0095756 A | | 8/2019 |
| KR | 10-2258557 B1 | | 6/2021 |

OTHER PUBLICATIONS

International Search Report for PCT/KR2022/008219 (PCT/ISA/210) mailed on Sep. 7, 2022.

European Communication pursuant to Article 94(3) EPC for European Application No. 22 825 237.5 dated Sep. 25, 2024.

* cited by examiner

Related Art

CONFIGURATION OF BATTERY MANAGEMENT DEVICE FOR TEMPERATURE MEASUREMENT OF MICROCONTROLLER, AND CONTROL METHOD THEREFOR

CROSS REFERENCE TO RELATED APPLICATIONS

This application is the National Phase of PCT/KR2022/008219 filed on Jun. 10, 2022, which claims priority under 35 U.S.C. § 119 (a) to Korean Patent Application No. 10-2021-0077454 filed on Jun. 15, 2021 in the Republic of Korea, all of which are hereby expressly incorporated by reference into the present application.

TECHNICAL FIELD

The present invention relates to a method for measuring the temperature of a microcontroller upon software update of a battery management system (BMS). The present invention relates to an apparatus and method for increasing the channel utilization of the microcontroller while accurately measuring the temperature of the microcontroller.

BACKGROUND ART

Heat generation in a microcontroller (MCU) of a Battery Management System (BMS) may be caused by a short circuit due to damage to other devices connected to the microcontroller, or an increase in the amount of computation in the microcontroller's own calculation process.

The temperature of the MCU rises, the computational processing power may decrease, such that when updating the software of the BMS, the amount of computation increases and the temperature further increases, or when the update is performed in a high temperature state, the normal update may not proceed.

Therefore, when the software update is in progress (boot mode), the temperature of the MCU must be measured, and whether to proceed with the software update must be determined according to the temperature value.

In order to measure the temperature of the MCU in the boot mode, a temperature sensing device of another device for BMS is conventionally used. When measuring the temperature with a temperature sensing device for BMS, there was a problem that the heat generated by the MCU could not be accurately measured by measuring the radiated temperature. To solve this problem, a sensing device such as a temperature sensor was separately allocated for temperature measurement of the MCU to detect the temperature.

However, in this case, since the channel that acquires data from the temperature sensing device assigned to the MCU is assigned only for temperature sensing when updating the BMS software, if it is not a software updater, that is, if operating a general application device, the channel is not used and is wasted, so that there is a problem that the limited number of channels of the MCU cannot be used effectively.

DISCLOSURE OF THE INVENTION

Technical Problem

The number of temperature channels of the microcontroller is limited, and it is necessary to measure the temperature of the battery and other power conversion devices and a plurality of application devices, so that many channels of the microcontroller are required. Accordingly, using one temperature channel only for the boot mode (SW update mode) deteriorates channel utilization.

Technical Solution

A battery management device includes: a microcontroller configured to control a boot mode and an application mode of a battery management system (BMS), and including a plurality of input/output channels; a first temperature measurement unit configured to measure one or more application temperatures of the BMS; a first switch having a first end connected to the first temperature measurement unit and a second end connected to a designated channel of the microcontroller among the plurality of input/output channels; a second temperature measurement unit configured to measure a temperature of the microcontroller; and a second switch having a first end connected to the second temperature measurement unit and a second end connected to the designated channel of the microcontroller, and each of the first switch and the second switch has an on/off state set differently according to a control of the microcontroller.

In detail, if there is a software update instruction, the microcontroller is further configured to turn turns on the second switch, control the first switch off, and receive temperature data measured by the second temperature measurement unit through the designated channel. The battery management device further includes a connection unit having a first end simultaneously connected to the second ends of the first switch and the second switch and a second end connected to the designated channel of the microcontroller.

More specifically, the microcontroller is further configured to include a control terminal for outputting an on/off control command to the first switch and the second switch, and The control terminal outputs a control signal for turning on the first switch and turning off the second switch in a regular mode or an application operation mode.

The control terminal outputs a power input on/off control signal to a power input path of the first temperature measurement unit and the second temperature measurement unit to control power on/off of the first temperature measurement unit and the second temperature measurement unit.

In a control method of a battery management device, the method includes: a software update command input step of receiving a software update command from a battery management system (BMS); a micro controller temperature measurement step of measuring a temperature of the microcontroller according to the software update command; a boot mode switching determination step of determining whether to proceed in a boot mode according to the measured temperature of the microcontroller; a boot mode starting step of starting the boot mode for performing a software update when the temperature of the microcontroller satisfies a predetermined condition in the boot mode switching determination step; and a boot mode ending step of ending the boot mode when the software update is finished.

Specifically, in the boot mode switching determination step, the predetermined condition is whether the measured temperature of the microcontroller is less than or equal to a predetermined reference temperature, and the microcontroller temperature measurement step blocks and controls a first path with the first temperature measurement unit that provides an application temperature measurement value through a designated channel of the microcontroller, and connects and controls a second path with the second temperature measurement unit to receive the measured temperature value of the microcontroller through the designated channel.

In more detail, if the temperature of the microcontroller does not satisfy the predetermined condition in the boot mode switching determination step, a standby mode is entered, and, in the standby mode, the temperature of the microcontroller is measured for a predetermined time, and the determination of whether the measured temperature of the microcontroller satisfies the predetermined condition is repeated.

Advantageous Effects

In order to solve the above problems, in the present invention, the boot mode (software update mode) and the application mode (or constant mode) are simultaneously performed through one channel of the microcontroller, so that an invention for accurately measuring the temperature of a microcontroller to ensure stability while not wasting a temperature channel is provided.

MODE FOR CARRYING OUT THE INVENTION

Figure 1:
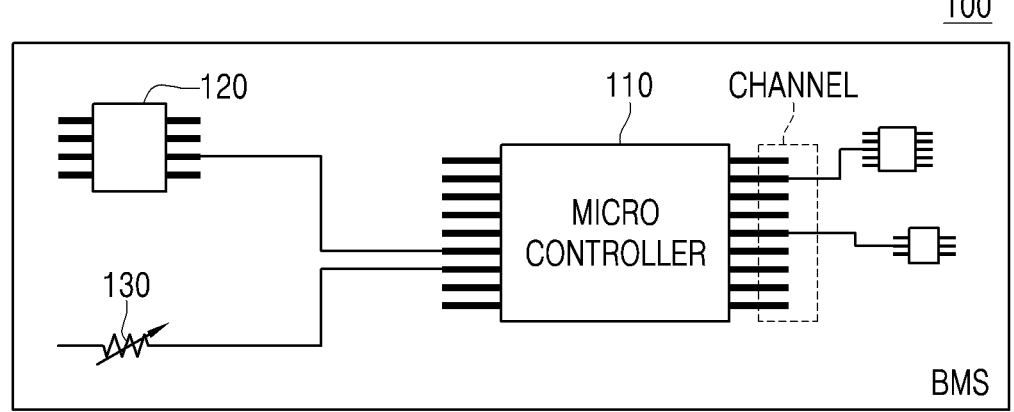
FIG. 1 shows a conventional BMS circuit diagram.

Hereinafter, embodiments of the present invention will be described in detail with reference to the accompanying drawings so that those of ordinary skill in the art may easily implement the present invention. However, the present invention may be implemented in various forms and is not limited to the embodiments described herein. In the drawings, parts irrelevant to the description are omitted in order to clearly describe the present invention, and like reference numerals refer to like elements throughout the specification.

1. Prior Art

In order to update the software of the microcontroller 110 configured to control the BMS 100, changing the mode of the control board and the application on which the microcontroller 110 is mounted is called a boot mode.

The heat generated by the microcontroller 110 may lengthen the calculation time in the internal calculation processing process or may prevent accurate calculation processing. Accordingly, the heat of the microcontroller 110 is measured before the boot mode operation.

Accordingly, the first temperature measurement unit 120 is used as an application temperature sensor mounted on the BMS to detect the heat of the microcontroller 110, and the first temperature measurement unit 120 measures radiation temperature, and there is a problem in that heat generated by the microcontroller 110 cannot be accurately detected. In order to improve this, the second temperature measurement unit 130 which is a temperature sensing device for the microcontroller for measuring the temperature of the microcontroller 110 is used. FIG. 1 shows this.

As shown in FIG. 1, the temperature information sensed by each temperature measurement unit is transmitted to the microcontroller through each channel of the microcontroller 110. Accordingly, as in FIG. 1, the first temperature measurement unit 120 (a device used for measuring application temperature) and the second temperature measurement unit 130 (a device used for measuring the microcontroller temperature) transmit temperature information to the microcontroller 110 through respective channels. That is, the first temperature measurement unit 120 and the second temperature measurement unit 130 occupy channels of the microcontroller 110, respectively.

The number of applications connected to a limited number of channels of the microcontroller 110 is increasing due to the improvement of the safety and function of the BMS. Accordingly, since the second temperature measurement unit 130 utilizes the channel only during software update (when operating in boot mode), it is left unused in the application mode, thereby reducing channel utilization.

Accordingly, the present invention provides a circuit and method for using one temperature channel in both the boot mode and the application mode to increase the limited channel utilization. FIG. 1 is a conventional BMS circuit diagram, in which only one application is connected to each channel of the microcontroller.

Figure 2:
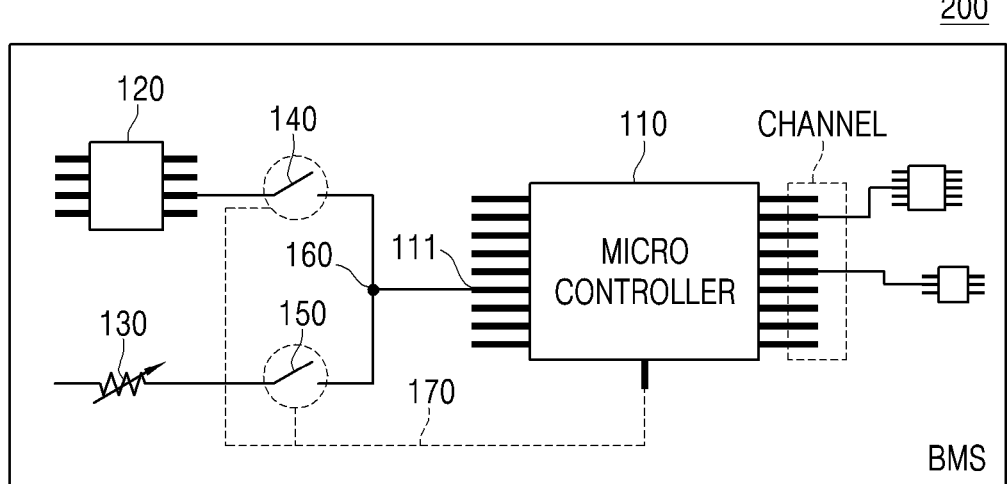
FIG. 2 shows a BMS circuit diagram of the present application.

2. Temperature Measurement Device of Microcontroller According to Present Invention FIG. 2 is a BMS circuit diagram 200 of the present invention. It is an invention to increase channel utilization by mounting two switches 140 and 150 that operate complementary to one channel of the microcontroller 110 and controlling the operation according to each mode. A battery management device BMS according to the present invention includes a microcontroller to be described later; first and second temperature measurement units, and first and second switches for connecting the outputs of the first and second temperature measurement units to the microcontroller, respectively, and according to the on/off operation of the first and second switches, the measurement data of the first and second temperature measurement units are input to the microcontroller. At this time, the measurement data of the first and second temperature measurement units are all input to the microcontroller through one designated channel 111, but the first and second switches are controlled to be complementary on/off, that is, when one is on, the other is turned off, and accordingly, the first and second switches are controlled so that the measurement data of the first and second temperature measurement units are not simultaneously input to the designated channel 111.

2.1. Micro Controller Unit (MCU) 110

A micro controller unit 110 is an ultra-small arithmetic processing device and is a device that receives and stores data such as battery current, voltage, temperature, etc. detected by multiple sensors that check the SOC of the battery in the BMS system and enables a protection circuit operation and battery switch on/off control.

Accordingly, in order to improve the control function of the BMS, the software of the micro controller unit 110 is updated.

In addition, the micro controller unit 110 serves to control a boot mode and an application mode for software update of the BMS. (The application mode is a mode in which applications required for BMS generally operate.)

In addition, it is a device that controls the first switch 140 and the second switch 150 to be described below, and receives and processes the temperature information measured by the first temperature measurement unit 120 and the second temperature measurement unit 130.

The micro controller unit 110 has a plurality of input/output channels, and each channel is connected to various application elements or devices of the BMS. Temperature information measured by the first and second temperature measurement units 120 and 130 is received through one channel 111 of the micro controller unit 110.

2.2. First Temperature Measurement Unit 120

The first temperature measurement unit 120 is a device for measuring application temperatures, and here, the application temperatures may be, for example, a temperature of a battery cell, a temperature of a power conversion device, or the like, or a temperature of a BMS. The first temperature measurement unit may be a temperature sensor or a thermistor, but the element is not particularly limited.

Such a first temperature measurement unit 120 is a temperature measurement device that operates in an application mode (or regular mode) in which the micro controller unit 110 controls applications, and as such a device, a thermistor or a temperature sensor is usually used, but is not limited thereto.

2.3. First Switch 140

It is a switch for connecting the channel of the first temperature measurement unit 120 and the micro controller unit 110, and is a device that allows the microcontroller to be connected to a device that measures temperature in application mode (or regular mode) where software update is completed or update is not performed.

2.4. Second Temperature Measurement Unit 130

It is a device composed of a temperature sensor or thermistor for measuring the temperature of the micro controller unit 110. The temperature information measured by the second temperature measurement unit is input to the micro controller unit 110 through the channel of the micro controller unit 110, and the second temperature measurement unit 130 may be operated only when a boot mode start command is input from the outside. This second temperature measurement unit 130 measures the temperature of the micro controller unit in the boot mode for updating the software of the BMS.

2.5. Second Switch 150

It is a switch that operates when a BMS software update command is applied to the BMS from the outside. It is a device that is electrically connected to the micro controller unit 110 and the second temperature measurement unit 130. The second switch 150 is connected to the same channel as the first switch 140. Accordingly, the first switch and the second switch operate complementary to each other, and are not turned on or off at the same time.

2.6. Connection Unit 160 of First Switch 140 and Second Switch 150

One ends of the first switch 140 and the second switch 150 are respectively connected to the first temperature measurement unit 120 and the second temperature measurement unit 130 to receive each temperature measurement data, and the other end of each of the first switch 140 and the second switch 150 is connected to one end of the connection unit 160.

The other end of the connection unit 160 is connected to one designated channel 111 of the micro controller unit 110.

Through this circuit configuration, according to the on/off of the first switch 140 and the second switch 150, one of the measured values of the first temperature measurement unit 120 and the second temperature measurement unit 130 is selectively input to the one channel 111 of the micro controller unit 110.

According to one embodiment of the present invention, in the regular mode or application mode of the battery management device, the first switch is on-controlled so that the temperature data measured by the first temperature measurement unit 120 is input to the designated channel 111, and in the boot mode, the first switch is controlled to be off and the second switch is controlled to be on so that it is controlled so that the temperature data measured by the second temperature measurement unit 130 is applied to the designated channel 111.

2.7. Control Terminal 170

It is a terminal for outputting a control signal for controlling on/off of the first switch 140 and the second switch 150, and is a terminal for transmitting a switch control signal output from the microcontroller. The first switch and the second switch are simultaneously controlled through one control terminal 170. In this case, the control signals transmitted through the control terminal 170 allow complementary operations to each other. For example, when the first switch signal is high, the second switch signal is low, and when the first switch signal is low, the second switch signal is high.

The control terminal 170 may control to turn on/off the power connection unit (not shown) of the first temperature measurement unit 120 and the second temperature measurement unit 130, respectively.

In this case, the first and second temperature measurement units may be controlled to operate only when necessary. For example, since the second temperature measurement unit 130 is for temperature measurement of the microcontroller in boot mode, when the micro controller unit operates in the application mode or the regular mode, the power of the second temperature measurement unit 130 may be controlled not to be connected.

The circuit of the battery management device of the present invention may include an individual power switch that provides power by connecting the power of the battery management device and the driving unit (not shown) of the first temperature measurement unit and the second temperature measurement unit, respectively, and the control terminal 170 may be configured to output an on/off control signal to the individual power switch to turn on/off the individual power switch. The on/off control signal output to the individual power switch may be interlocked with the on/off control signal of the first switch 140 and the second switch 150, and a buffer or delay element having a predetermined delay may be configured on the path so that the power-on signal is first applied to the first and second temperature measurement units and the power-off signal is applied later.

The above-described control terminal 170 may be used to output a control signal by designating a general purpose input output (GPIO) of the micro controller unit, and the control terminal 170 may be configured to receive a boot mode progress command or a software update command from the outside.

Figure 3:
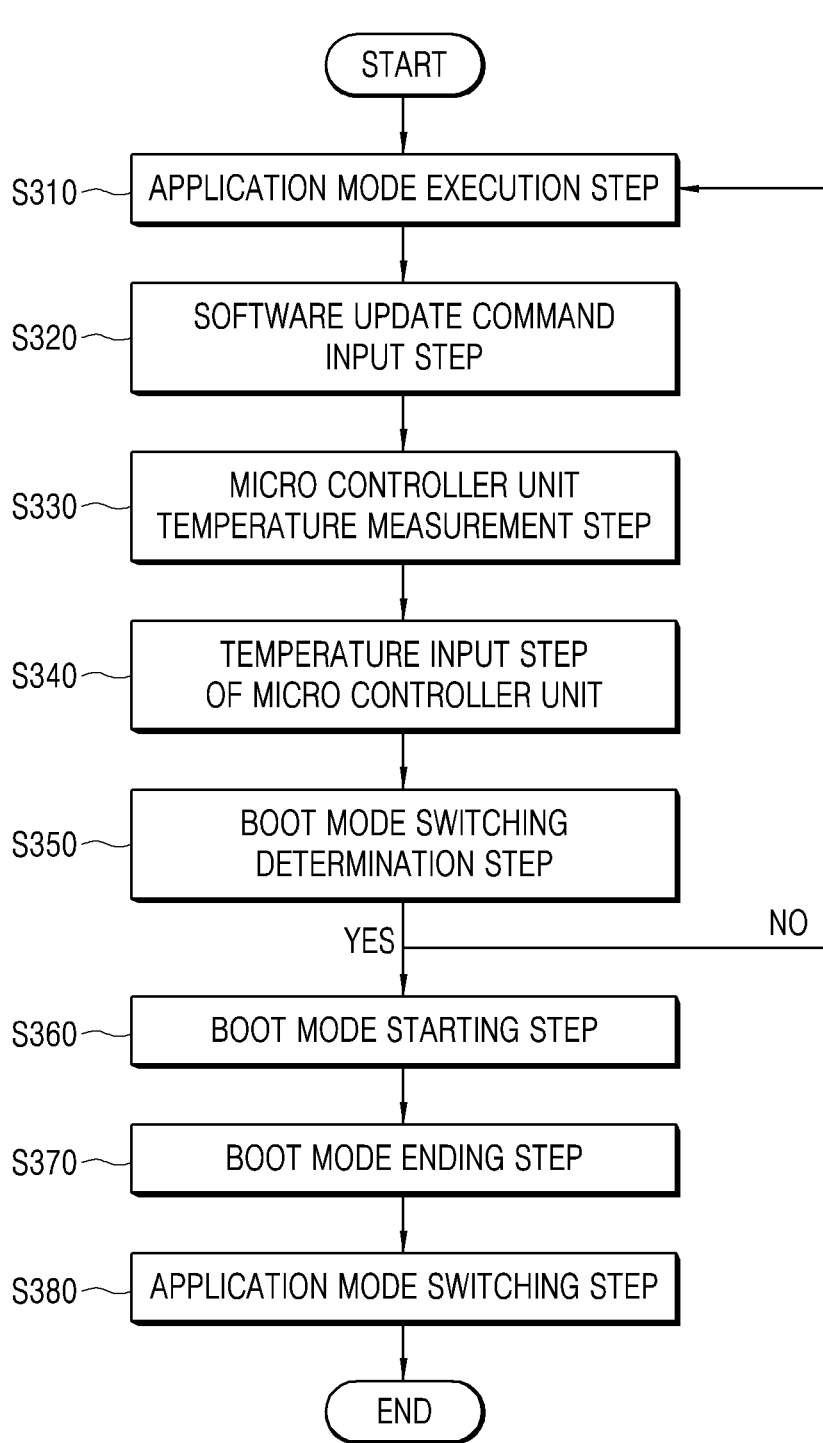
FIG. 3 is a flowchart of the present invention.

3. Method for Measuring Temperature in Application Mode and Boot Mode Through Channel Sharing According to Present Invention and Boot Mode Execution Procedure Accordingly The present invention relates to a method of a channel utilization device for temperature measurement of a microcontroller according to the present invention. In the present invention, a method for measuring a temperature in a microcontroller boot mode will be described. FIG. 3 shows an example of the method of the present invention.

A mode for performing a software update is called a boot mode, and a mode in which each application operates according to a necessary situation is called an application mode (or regular mode).

3.1. Application Mode Execution Step S310

It is a step of turning on the first switch 140 of FIG. 2 to receive temperature data measured by the first temperature measurement unit 120 from the micro controller unit 110.

This is a step in which the first temperature measurement unit 120 measures the temperature of the application, the measured temperature data is input to the microcontroller, and the application is performed accordingly. It is a step in which the second switch is OFF, so that the temperature measured by the second temperature measurement unit is not transmitted to the microcontroller.

The application temperature measurement data measured in the application mode execution step is input to the designated channel 111 of the microcontroller.

3.2. Software Update Command Input Step S320

This is a step in which a command to proceed with software update of the BMS is inputted from the outside or the inside, and accordingly, is a step to prepare for boot mode operation.

This is a step of turning off the first switch 140 and turning on the second switch 150. The on/off of the first and second switches is controlled through the control terminal 170 of the above-described micro controller unit.

3.3. Micro Controller Unit Temperature Measurement Step S330

This is the step of measuring the temperature of the micro controller unit according to the command input through the software update command input step. The temperature measurement operation of the micro controller unit controls the first switch 140 to be turned off through the control terminal 170 by the step of inputting a software update command, and controls the second switch 150 to be on, and accordingly, the temperature is measured by the second temperature measurement unit 130 mounted close to the micro controller unit or mounted on the micro controller unit. The temperature data measured by the second temperature measurement unit 130 is input to the micro controller unit through the same designated channel 111 as the designated channel 111 to which the application temperature measurement data is input.

The temperature measurement step of this micro controller unit receives the measured temperature value of the micro controller unit through the designated channel connected to receive the application measured temperature value by blocking and controlling the path with the first temperature measurement unit that provides the application temperature measurement value with a predetermined designated channel of the micro controller unit, and connecting and controlling a path with the second temperature measurement unit that provides the measurement temperature of the micro controller unit through the designated channel.

3.4. Boot Mode Procedure

This is a step in which the micro controller unit determines whether the boot mode (software update mode) operation is possible through the input temperature data.

3.4.1. Temperature Input Step of Micro Controller Unit S340

Instead of the temperature data measured by the first temperature measurement unit operating in the application mode, the temperature data measured by the second temperature measurement unit measuring the temperature of the micro controller unit is input to the micro controller unit. That is, it is a step of receiving the temperature of the micro controller unit measured in the micro controller unit temperature measurement step S320. The temperature measured by the second temperature measurement unit 130 is transmitted to the micro controller unit through the second switch 150 in the designated channel 111.

3.4.2. Boot Mode Switching Determination Step S350

Through the temperature input step of the micro controller unit to which the temperature data measured by the second temperature measurement unit is input, boot mode conversion is determined through the temperature input to the micro controller unit. It is to determine whether to proceed in boot mode according to the measured temperature condition of the micro controller unit. In this case, when the temperature of the micro controller unit satisfies a predetermined condition, it is whether the measured temperature of the micro controller unit is less than or equal to a predetermined reference temperature.

The determination method is to set a reference temperature of a predetermined value (predetermined reference temperature may be set in advance), and switches to the boot mode according to the relationship between the reference temperature and the measured temperature of the micro controller unit measured through the second temperature measurement unit.

When the measured temperature of the micro controller unit exceeds the reference temperature, the application mode may proceed or perform a step for lowering the temperature of the micro controller unit, but the boot mode does not proceed.

When the measured temperature of the micro controller unit is below the reference temperature, the boot mode is performed. Through the control terminal 170, the second switch maintains an on state, and the first switch controls to maintain an off state. The temperature data measured by the second temperature measurement unit passes through the connection unit 160 and is input to the micro controller unit 110 through the designated channel 111.

If the measured temperature of the micro controller unit exceeds the reference temperature, it may proceed with an application mode or a standby step (not shown) to lower the temperature of the micro controller unit. The application mode is controlled so that the first switch 140 is turned on and the second switch 150 is turned off through the control terminal 170. The application temperature measured through the first temperature measurement unit 120 is input to the micro controller unit 110 through the connection unit 160 through the designated channel 111. After that, the application mode is maintained.

In a case of performing the standby step, while the second switch maintains an on state, and the first switch is in a controlled state to maintain an off state, it maintains the software update standby state for a predetermined period of time. In the update standby state, the designated channel 111 receives the temperature of the micro controller unit measured by the second temperature measurement unit, checks whether it is below the reference temperature, and enters the boot mode if it is below the reference temperature.

That is, when the temperature of the micro controller unit does not satisfy the predetermined condition in the boot mode switching determination step, it may enter the standby mode and measures the temperature of the micro controller unit for a predetermined time in the standby mode, and perform a procedure of repeatedly comparing whether the measured temperature of the micro controller unit satisfies a predetermined condition.

If the temperature of the micro controller unit measured by the second temperature measurement unit for the predetermined time does not become less than the reference temperature, it may be controlled to notify the software update failure and enter the application mode.

3.4.3. Boot Mode Starting Step S360

This is a step in which software and hardware of the BMS are switched to a mode for software update, and only devices necessary for software update are operated, and devices not required for software update are switched to sleep mode (or turned off). After that, it is a step to proceed with the software update of the BMS.

When information on boot mode start is input in the boot mode switching determination step S350, the micro controller unit 110 instructs mode switching according to the boot mode. Through the control terminal 170, the first switch 140 is controlled to keep it on, and the second switch 150 is controlled to keep it off. Accordingly, the temperature of the micro controller unit 110 measured through the second temperature measurement unit 130 is input to the designated channel 111 through the connection unit 160 and is input to the micro controller unit 110. This state is maintained during boot mode.

3.5. Boot Mode Ending Step S370

This is a step to stop the boot mode when a command indicating that the software update of the BMS is complete is input from the inside of the micro controller unit (not shown).

Through the control terminal 170, the second switch 150 is turned off, and the first switch 140 is on.

3.6. Application Mode Switching Step S380

After exiting the boot mode, the original application mode (or regular mode) is started. Accordingly, the second switch 150 is turned off, and the designated temperature channel 111 of the micro controller unit is connected to the first temperature measurement unit 120 to receive a measurement temperature (application temperature) of the first temperature measurement unit 120.

The temperature measurement of the micro controller unit 110 is stopped, and the first switch 130 is turned on to operate the first temperature measurement unit 120.

On the other hand, although the technical idea of the present invention has been specifically described according to the above embodiment, it should be noted that the above embodiments are for the purpose of explanation and not limitation. In addition, those skilled in the art in the technical field of the present invention will be able to understand that various embodiments are possible within the scope of the spirit of the present invention.

The invention claimed is:

1. A battery management device comprising:
a microcontroller configured to control a boot mode and an application mode of a battery management system (BMS), and including a plurality of input/output channels;
a first temperature measurement unit configured to measure one or more application temperatures of the BMS;
a first switch having a first end connected to the first temperature measurement unit and a second end connected to a designated channel of the microcontroller among the plurality of input/output channels;
a second temperature measurement unit configured to measure a temperature of the microcontroller; and
a second switch having a first end connected to the second temperature measurement unit and a second end connected to the designated channel of the microcontroller,
wherein each of the first switch and the second switch has an on/off state set differently according to a control of the microcontroller.

2. The battery management device of claim 1, wherein if there is a software update instruction, the microcontroller is further configured to turn on the second switch, control the first switch off, and receive temperature data measured by the second temperature measurement unit through the designated channel.

3. The battery management device of claim 1, further comprising a connection unit having a first end simultaneously connected to the second ends of the first switch and the second switch and a second end connected to the designated channel of the microcontroller.

4. The battery management device of claim 1, wherein the microcontroller is further configured to include a control terminal for outputting an on/off control command to the first switch and the second switch, and
wherein the control terminal outputs a control signal for turning on the first switch and turning off the second switch in a regular mode or an application operation mode.

5. The battery management device of claim 4, wherein the control terminal outputs a power input on/off control signal to a power input path of the first temperature measurement unit and the second temperature measurement unit to control power on/off of the first temperature measurement unit and the second temperature measurement unit.

6. A control method of a battery management device, the method comprising:
a software update command input step of receiving a software update command from a battery management system (BMS);
a micro controller temperature measurement step of measuring a temperature of the microcontroller according to the software update command;
a boot mode switching determination step of determining whether to proceed in a boot mode according to the measured temperature of the microcontroller;
a boot mode starting step of starting the boot mode for performing a software update when the temperature of the microcontroller satisfies a predetermined condition in the boot mode switching determination step; and
a boot mode ending step of ending the boot mode when the software update is finished.

7. The method of claim 6, wherein in the boot mode switching determination step, the predetermined condition is whether the measured temperature of the microcontroller is less than or equal to a predetermined reference temperature.

8. The method of claim 7, wherein in the microcontroller temperature measurement step, the microcontroller blocks and controls a first path with the first temperature measurement unit that provides an application temperature measurement value through a designated channel of the microcontroller, and connects and controls a second path with the second temperature measurement unit to receive the measured temperature value of the microcontroller through the designated channel.

9. The method of claim 6, wherein if the temperature of the microcontroller does not satisfy the predetermined condition in the boot mode switching determination step, a standby mode is entered, and
wherein in the standby mode, the temperature of the microcontroller is measured for a predetermined time, and the determination of whether the measured temperature of the microcontroller satisfies the predetermined condition is repeated.

* * * * *